United States Patent [19]

Ueno

[11] Patent Number: 4,996,449
[45] Date of Patent: Feb. 26, 1991

[54] OUTPUT CIRCUIT HAVING HIGH SPEED OPERATION AND LOW POWER DISSIPATION

[75] Inventor: Masaji Ueno, Yokohama, Japan

[73] Assignee: Kabushiki Kaisha Toshiba, Kawasaki, Japan

[21] Appl. No.: 380,335

[22] Filed: Jul. 17, 1989

[30] Foreign Application Priority Data

Jul. 19, 1988 [JP] Japan .................. 63-179682

[51] Int. Cl.⁵ ............................. H03K 19/02
[52] U.S. Cl. ................... 307/446; 307/597
[58] Field of Search ........... 307/443, 446, 473, 570, 307/592, 594, 597

[56] References Cited

U.S. PATENT DOCUMENTS

| | | | |
|---|---|---|---|
| 4,339,676 | 7/1982 | Ramsey | 307/473 |
| 4,347,447 | 8/1982 | Proebsting | 307/473 |
| 4,425,517 | 1/1984 | Smith | 307/473 |
| 4,612,466 | 9/1986 | Stewart | 307/473 |
| 4,638,187 | 1/1987 | Boler et al. | 307/473 |
| 4,677,313 | 3/1987 | Mimoto | 307/443 |
| 4,797,584 | 1/1989 | Aguti et al. | 307/443 |
| 4,918,339 | 4/1990 | Shigeo et al. | 307/443 |
| 4,933,579 | 6/1990 | Isobe et al. | 307/473 |

FOREIGN PATENT DOCUMENTS

| | | |
|---|---|---|
| 0031907 | 7/1981 | European Pat. Off. . |
| 0239762 | 7/1987 | European Pat. Off. . |
| 0238358 | 9/1987 | European Pat. Off. . |
| 0264614 | 4/1988 | European Pat. Off. . |
| 0181231 | 11/1982 | Japan .................. 307/473 |

Primary Examiner—Stanley D. Miller
Assistant Examiner—T. Cunningham
Attorney, Agent, or Firm—Finnegan, Henderson, Farabow, Garrett, and Dunner

[57] ABSTRACT

There is provided an improved output circuit having high speed operation and low power dissipation. The circuit having MOS pull up and pull down transistors, wherein a control signal to the pull down MOS is delayed to discharge parasitic capacitance and to prevent both MOS transistors from being on simultaneously.

3 Claims, 1 Drawing Sheet

OUTPUT CIRCUIT HAVING HIGH SPEED OPERATION AND LOW POWER DISSIPATION

BACKGROUND OF THE INVENTION

1. Field of the Invention

The present invention relates to a high breakdown voltage output circuit for shifting a level of a low-voltage output signal to output a high-voltage output signal.

2. Description of the Related Art

In general, since an IC for driving a light-emitting display such as an electroluminescence display or a plasma display panel requires a high drive voltage, drive ICs having high breakdown voltage characteristics have been used. In an output circuit in the drive IC, high breakdown voltage characteristics, a short switching time, and low power consumption have been demanded. For this reason, a CMOS circuit is used to receive an input signal to output a low-voltage signal, and a high-voltage signal obtained by shifting the level of the low-voltage signal is output from a push-pull output stage.

FIG. 1 is a circuit diagram showing a conventional output circuit used for the above-mentioned drive IC. A CMOS inverter 23 is inserted between a low-voltage power supply $V_{DD}$ and a ground voltage $V_{SS}$. In the CMOS inverter 23, the gates and drains of a p-channel MOS transistor 21 and an n-channel MOS transistor 22 are commonly connected to each other. The emitter of a high breakdown voltage pnp transistor 24 is connected to a high-voltage power source $V_{CC}$. The transistor 24 has a multicollector structure. A first collector 25 is connected to the base of the transistor 24. The base of the pnp transistor 24 is connected to the drain of an n-channel DMOS (double diffused MOS) transistor 26, the gate of which is connected to a common drain of the CMOS inverter 23, and the source of which is connected to the ground voltage $V_{SS}$. A second collector 27 of the pnp transistor 24 is connected to the drain of an output pull-down n-channel DMOS transistor 28, the gate of which is connected to a common gate of the CMOS inverter 23, and the source of which is connected to the ground voltage $V_{SS}$. In addition, the gate of an output pull-up n-channel DMOS transistor 29 is connected to the second collector 27. The drain of the transistor 29 is connected to the high-voltage power source $V_{CC}$, and a cathode-anode path of a Zener diode 30 is connected to a source-drain path of the transistor 29. An input signal IN is supplied from the common gate of the CMOS inverter 23, and an output signal OUT is output from the source of the n-channel DMOS transistor 29 through an output terminal.

In the circuit with the above arrangement, when the input signal IN is set at "L" level, the transistor 21 in the CMOS inverter 23 is turned on, and the transistor 22 is turned off. Therefore, the n-channel DMOS transistor 26 is turned on in response to the output signal set at $V_{DD}$ level. Therefore, the pnp transistor 24 having the multicollector structure is turned on, and a voltage drop occurs across the Zener diode 30 in response to this ON current, thus turning on the n-channel DMOS transistor 29. As a result, a parasitic capacitance of the output terminal is charged, and the output OUT goes to "H", i.e., $V_{CC}$ level.

When the input signal IN is set at "H" level, the transistor 21 in the CMOS inverter 23 is turned off, and the transistor 22 is turned on. Therefore, the transistor 26 is turned off. The transistor 28 is turned on in response to the input signal IN set at "H" level. As a result, the transistor 29 is turned off, and the output Out goes to "L" level.

The high-voltage power supply $V_{CC}$ is used in the circuit shown in FIG. 1. Therefore, even if a slight current flows, power consumption is high. In order to minimize the power consumption, an operation current of the level shift transistor 24 must be decreased. Conventionally, an ON current of the transistor 26 has been decreased to solve the above problem. However, the MOS transistor 26 and the transistor 24 constitute a current mirror circuit. Therefore, when the ON current of the MOS transistor 26 is decreased, a current supplied to the collector of the transistor 24 is also decreased. During a pull-up operation of the output, a predetermined voltage drop occurs across the Zener diode 30 in response to a current supplied to the collector 27 of the transistor 24. The gate potential of the MOS transistor 29 is increased, and the transistor 29 is turned on. At this time, the gate potential of the MOS transistor 29 is increased while the parasitic capacitance in the drain of the MOS transistor 28 is charged. At this time, a delay time $\Delta t$ of a change in gate potential of the MOS transistor 29 with respect to the gate potential of the MOS transistor 26 is as follows:

$$\Delta t = C/i \qquad (1)$$

where C is a parasitic capacitance of a node of the gate of the MOS transistor 29 including the parasitic capacitance in the transistor 28, and i is a current supplied to the collector 27 of the transistor 24. Therefore, when a collector current of the transistor 24 is decreased, the delay time $\Delta t$ is increased. The element sizes of the MOS transistors 28 and 29 are set to be large to realize a sufficiently high load drive capability in order to pull-up or -down the output. Therefore, the value of the parasitic capacitance C is also large. For this reason, a long signal propagation time is present between the input and output operations, and a high-speed operation cannot be achieved in the conventional circuit.

SUMMARY OF THE INVENTION

It is an object of the present invention to provide an output circuit which can achieve low power consumption and a high-speed operation.

There is provided an output circuit according to the present invention comprising a first MOS transistor, a drain-source path of which is inserted between a first potential and an output terminal, a level shift transistor inserted between the first potential and the gate of a first MOS transistor, a second MOS transistor, a drain-source path of which is inserted between a control terminal of the level shift transistor and a second potential, and the gate of which receives a first control signal, a constant voltage element inserted between the gate of the first MOS transistor and the output terminal, a third MOS transistor, a drain-source path of which is inserted between the output terminal and the second potential through the constant voltage element, and the gate of which receives a second control signal having a phase opposite to that of the first control signal, a signal delay circuit for delaying the second control signal for a predetermined period of time to output a third control signal, and a fourth MOS transistor, a drain-source path of which is inserted between the output terminal and the second potential, and the gate of which receives the third control signal, wherein the element size of the third MOS transistor is smaller than that of the fourth MOS transistor.

Since the third MOS transistor connected to the collector of the level shift transistor has a small parasitic capacitance, a delay time when the gate potential of the output pull-up first MOS transistor is increased is reduced. Therefore, even if a limited current is supplied to achieve low power consumption during an output pull-up operation, a delay can be minimized. In addition, a signal delay circuit is arranged in the output pull-down fourth MOS transistor to delay its gate signal, so that a current flow through the first and fourth MOS transistors can be prevented.

DETAILED DESCRIPTION OF THE PREFERRED EMBODIMENT

An embodiment of the present invention will be described hereinafter with reference to the accompanying drawings.

Figure 1:
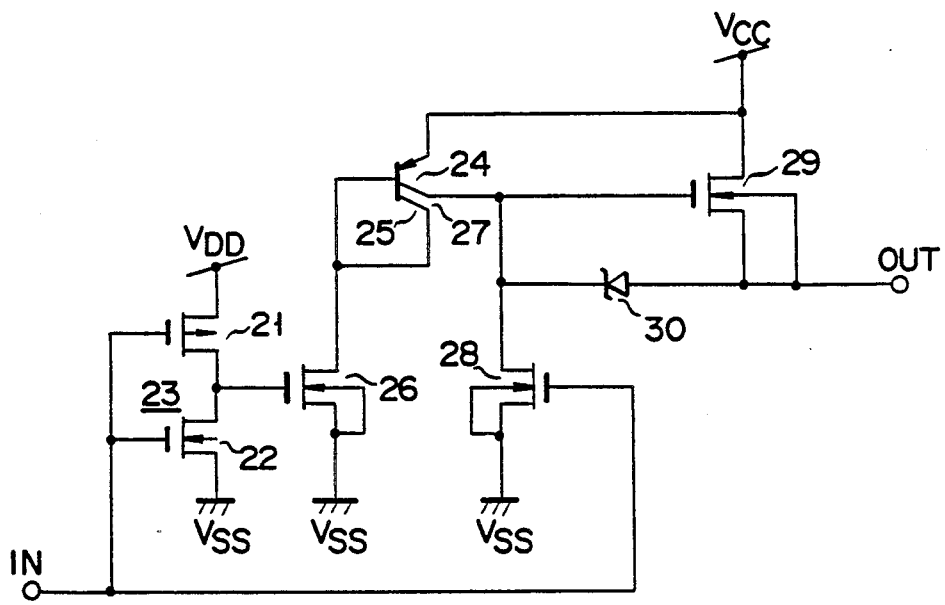
FIG. 1 is a circuit diagram showing a conventional output circuit.
Figure 2:
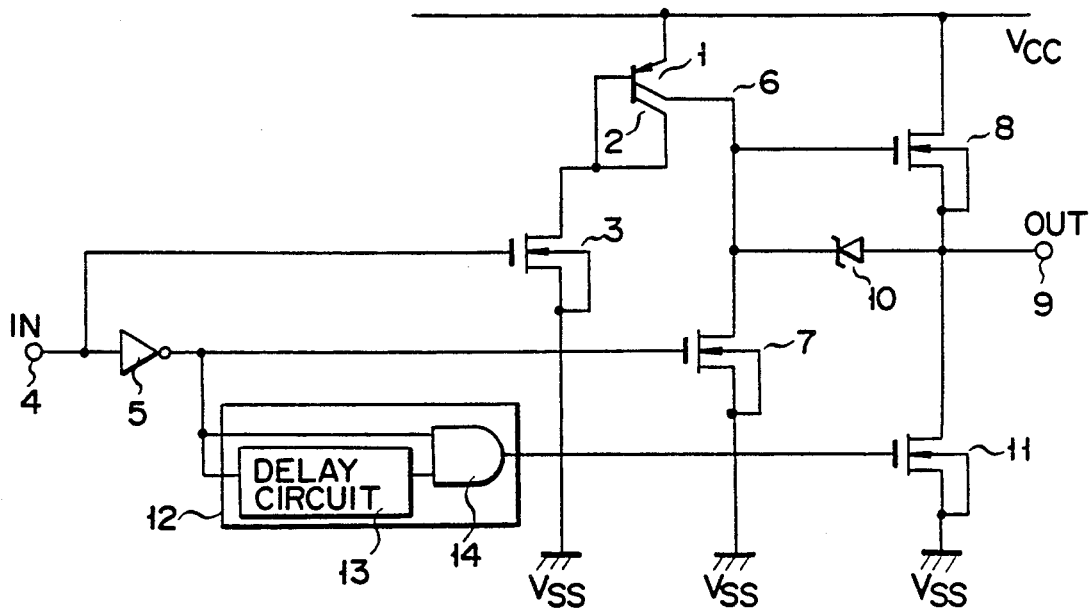
FIG. 2 is a circuit diagram showing an arrangement of an output circuit according to an embodiment of the present invention.

FIG. 2 is a circuit diagram showing an arrangement of an output circuit according to an embodiment of the present invention. The emitter of a high breakdown voltage pnp multicollector transistor 1 is connected to a high-voltage power source $V_{CC}$. A first collector 2 of the transistor 1 is connected to its base. The base of the transistor 1 is connected to the drain of an n-channel DMOS transistor 3. The gate of the transistor 3 is connected to an input terminal 4 for receiving an input signal IN. The source of the transistor 3 is connected to a ground voltage $V_{SS}$. The input terminal of an inverter 5 operated by a low-voltage power source $V_{DD}$ is connected to the input terminal 4.

A second collector 6 of the transistor 1 is connected to the drain of an n-channel DMOS transistor 7. The gate of the transistor 7 is connected to an output terminal of the inverter 5. The source of the transistor 7 is connected to the ground voltage $V_{SS}$. The drain of an n-channel DMOS transistor 8 is connected to the high-voltage power source $V_{CC}$. The gate of the transistor 8 is connected to the second collector 6 of the transistor 1. The source of the transistor 8 is connected to an output terminal 9 for outputting an output signal OUT.

A Zener diode 10 having polarities shown in FIG. 2 is connected between the gate of the transistor 8 and the output terminal 9. The drain of an n-channel DMOS transistor 11 is connected to the output terminal 9. The source of the transistor 11 is connected to the ground voltage $V_{SS}$.

An input terminal of a signal delay controller 12 is connected to the output terminal of the inverter 5. The signal delay controller 12 includes a delay circuit 13 for delaying an output signal from the inverter 5 for a predetermined period of time, and an AND gate 14 for receiving output signals from the delay circuit 13 and the inverter 5. The output terminal of the signal delay controller 12 is connected to the gate of the transistor 11. Note that the element size, e.g., the channel width, of the transistor 7 is set to be sufficiently smaller than those of the transistors 8 and 11. The conductance of the transistor 7 is sufficiently smaller than those of the transistors 8 and 11.

An operation of the circuit with the above arrangement will be described hereinafter. When the input signal IN goes to "H" level from "L" level, the transistor 3 is turned on. At this time, since the output signal from the inverter 5 goes to "L" level from "H" level, the transistor 7 is turned off. In addition, the output signal from the AND gate 14 in the signal delay controller 12 goes to "L" level, and the transistor 11 is turned off. When the transistor 3 is turned on, the level shift transistor 1 is turned on. A current is supplied from the second collector 6 to the Zener diode 10, and a predetermined voltage drop occurs across an anode-cathode path of the Zener diode 10. This voltage is applied to a gate-source path of the transistor 8, so that the transistor 8 is turned on. The output terminal 9 is charged by the high-voltage power source $V_{CC}$, and the output signal OUT is set at $V_{CC}$ level.

The element size of the transistor 7 is set to be sufficiently smaller than that of the transistor 11, and the value of a parasitic capacitance present in the node of the gate of the transistor 8 is also sufficiently small when viewed from the collector 6 of the transistor 1. For this reason, when the value of an ON current of the transistor 1 is set to be equal to the conventional value, the parasitic capacitance in the node of the gate of the transistor 8 is charged at a higher speed than that in the conventional case upon setting the output signal OUT at $V_{CC}$ level.

On the other hand, when the input signal IN goes to "L" level from "H" level, the transistor 3 is turned off. At this time, the output signal from the inverter 5 goes to "H" level from "L" level, and the transistor 7 is turned on. When the transistor 7 is turned on, the parasitic capacitance of the drain-gate path of the transistor 7 and the parasitic capacitance of the gate of the transistor 8 are discharged to the ground voltage $V_{SS}$. Therefore, when a predetermined time period has elapsed after the output signal from the inverter 5 goes to "H" level, the output signal from the signal delay controller 12 goes to "H" level from "L" level. Therefore, the transistor 11 is turned on, and the parasitic capacitance of the output terminal 9 is discharged to the ground voltage $V_{SS}$ through the transistors 7 and 11. The output signal OUT is set at ground voltage $V_{SS}$ level. When the output signal from the signal delay controller 12 goes to "H" level and the transistor 11 starts to be turned on, the transistor 8 has already been turned off. Therefore, a current does not flow between the high-voltage power source $V_{CC}$ and the ground voltage $V_{SS}$.

Thus, according to the circuit of this embodiment, the value of the parasitic capacitance connected to the node of the gate of the transistor 8 is smaller than that of the conventional circuit. Therefore, when an ON current of the transistor 1 is substantially equal to that of the conventional circuit, a signal delay time can be reduced, as compared with that of the conventional circuit. Since the transistor 11 discharges the parasitic capacitance of the output terminal 9 at high speed, its conductance must be increased to some extent. However, a timing at which a control signal is supplied to the gate of the transistor 11 is delayed with respect to a timing at which the input signal IN is supplied. For this reason, a current flowing between the high-voltage power source $V_{CC}$ and the ground voltage $V_{SS}$ through the transistors 8 and 11 is not present. Therefore, even if the transistor 11 is arranged, power consumption is not increased.

Note that various changes and modifications of the output circuit of the present invention may be made. For example, although a high breakdown voltage bipolar transistor is used as a level shift circuit in the circuit of this embodiment, a high breakdown voltage MOS field effect transistor can be used. The circuit which generates a signal for controlling such an output circuit is not limited to a specific one, and an arrangement of the delay signal controller is not limited.

What is claimed is:

1. An output circuit comprising:

a first MOS transistor, a source-drain path of which is connected between a first potential and an output terminal;

a level shift bipolar transistor connected between said first potential and a gate of said first MOS transistor;

a second MOS transistor, a source-drain path of which is connected between a control terminal of said bipolar transistor and a second potential, and a gate of which receives a first control signal;

a constant voltage element connected between the gate of said first MOS transistor and said output terminal;

a third MOS transistor having an element size smaller than that of a fourth MOS transistor, a source-drain path of said third MOS transistor being connected between a node of said gate of said first MOS transistor, a first collector of said bipolar transistor, and said constant voltage element, and said second potential, and a gate of said third MOS transistor receiving a second control signal which is an inversion of the first control signal; and the fourth MOS transistor, a source-drain path of which is connected between said output terminal and said second potential, and a gate of which receives a third control signal obtained by delaying the second control signal by a predetermined period of time.

2. A circuit according to claim 1, wherein the second control signal is obtained by inverting the first control signal by an inverter.

3. A circuit according to claim 1, wherein the third control signal is obtained by a signal delay controller comprising an AND gate, one input terminal of which receives the second control signal, and an other input terminal of which receives the second control signal delayed by a predetermined period of time, and a delay circuit for delaying the second control signal by the predetermined period of time.

* * * * *